(12) United States Patent
Katsumata et al.

(10) Patent No.: US 11,479,686 B2
(45) Date of Patent: Oct. 25, 2022

(54) CONDUCTIVE COMPOSITION AND WIRING BOARD USING THE SAME

(71) Applicant: Yazaki Corporation, Tokyo (JP)

(72) Inventors: Rie Katsumata, Shizuoka (JP); Maki Yamada, Shizuoka (JP); Shota Sato, Shizuoka (JP); Yukito Aoyama, Shizuoka (JP); Kosuke Tashiro, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 16/800,613

(22) Filed: Feb. 25, 2020

(65) Prior Publication Data
US 2020/0190350 A1    Jun. 18, 2020

Related U.S. Application Data

(63) Continuation of application No. PCT/JP2018/026814, filed on Jul. 18, 2018.

(30) Foreign Application Priority Data

Sep. 20, 2017 (JP) .............................. JP2017-179961
Jun. 15, 2018 (JP) .............................. JP2018-114377

(51) Int. Cl.
*C09D 11/52*     (2014.01)
*C09D 11/037*    (2014.01)
*C09D 11/14*     (2006.01)
*H05K 1/09*      (2006.01)
*C09D 11/102*    (2014.01)

(52) U.S. Cl.
CPC ............ *C09D 11/52* (2013.01); *C09D 11/037* (2013.01); *C09D 11/102* (2013.01); *C09D 11/14* (2013.01); *H05K 1/097* (2013.01); *H05K 2201/0776* (2013.01)

(58) Field of Classification Search
CPC ..................................................... C09D 11/52
See application file for complete search history.

(56) References Cited

U.S. PATENT DOCUMENTS

| | | | |
|---|---|---|---|
| 2009/0146117 A1* | 6/2009 | Suenaga ................... | B22F 1/16 252/520.3 |
| 2014/0346412 A1 | 11/2014 | Okamoto et al. | |
| 2015/0252224 A1* | 9/2015 | Iseda ........................ | H01L 24/29 428/323 |
| 2018/0193913 A1* | 7/2018 | Iwai .......................... | C08K 3/08 |

FOREIGN PATENT DOCUMENTS

| | | |
|---|---|---|
| JP | 2000-239636 A | 9/2000 |
| JP | 2011-238596 A | 11/2011 |
| JP | 2012-084440 A | 4/2012 |
| JP | 2013-134914 A | 7/2013 |
| JP | 2013-142173 A | 7/2013 |
| WO | 2017/033911 A1 | 3/2017 |

OTHER PUBLICATIONS

International Search Report for PCT/JP2018/026814 dated Oct. 16, 2018 (PCT/ISA/210).

* cited by examiner

*Primary Examiner* — William D Young
(74) *Attorney, Agent, or Firm* — Sughrue Mion, PLLC

(57) ABSTRACT

The conductive composition of the present embodiment contains metal nanoparticles having an average particle diameter of 30 nm to 600 nm, metal particles having an average particle diameter larger than that of the metal nanoparticles, a thermosetting resin having an oxirane ring in a molecule, a curing agent, and a cellulose resin. Then, the specific resistance of the conductor formed by applying and calcining the conductive composition on the substrate is preferably $5.0 \times 10^{-6}$ Ω·cm or less, and the conductor does not peel from the substrate when a tape having an adhesive force of 3.9 N/10 mm to 39 N/10 mm is pressed against the conductor and peeled off.

7 Claims, No Drawings

CONDUCTIVE COMPOSITION AND WIRING BOARD USING THE SAME

CROSS REFERENCE TO RELATED APPLICATION

This application is a Continuation of PCT Application No. PCT/JP2018/026814, filed on Jul. 18, 2018, and claims the priority of Japanese Patent Application No. 2017-179961, filed on Sep. 20, 2017 and 2018-114377 filed on Jun. 15, 2018, the content of all of which is incorporated herein by reference.

BACKGROUND

1. Technical Field

The present invention relates to a conductive composition and a wiring board using the same. Specifically, the present invention relates to a conductive composition capable of obtaining a conductor having a specific resistance equivalent to that of silver bulk and having excellent adhesion to a substrate, and a wiring board using the conductive composition.

2. Related Art

In recent years, a flexible printed wiring board that can achieve miniaturization, thinning, three-dimensionalization, and the like of a wire harness and peripheral parts thereof has been demanded in accordance with a reduction in a wiring space of a vehicle. In particular, a map lamp provided in the vicinity of a room mirror and located at the front center of a car compartment is required to be thin. In other words, in accordance with the evolution of automatic brake vehicles and autonomous driving vehicles, the function integration of cameras and sensor modules advances, and the cameras and sensor modules are required to be installed on the back side of the map lamp, and thereby, it is essential to make the map lamp thinner. For this reason, the need for the flexible printed wiring board as described above has been increasing in order to make the map lamp thinner.

As a flexible printed wiring board that responds to demands for miniaturization, thinning, three-dimensionalization, and the like, there is known a flexible printed wiring board (FPC) in which an electric circuit is formed on a substrate obtained by bonding a thin and soft base film with electrical insulation to a conductive metal such as copper foil. The FPC circuit is usually manufactured by a method called a subtract method. For example, a circuit can be formed by bonding a metal foil such as copper to a polyimide film and etching the metal foil. Such a subtract method requires a complicated and very long process such as photolithography, etching, or chemical vapor deposition, and thereby there is a problem in that a throughput is very low. Further, in the processes such as photolithography or etching, problems relating to the environment such as waste liquid are always regarded as problems.

In order to solve the above-describe problems, an additive method in which a conductor pattern is formed on an insulating plate is examined in the reverse of the subtract method. There are various kinds of the additive methods, and examples thereof mainly include plating and printing a conductive composition; depositing metal on a necessary part of a substrate; wiring a cable that is sheathed with polyimide; and adhering a previously formed pattern to a substrate.

Among these additive methods, a printing method is exemplified as a method in which the throughput is the highest. In the printing method, an electric circuit is established by mainly using a film as a substrate, further using a conductive ink or a conductive composition as a conductive wire material, and combining an insulating film, a resist, or the like therewith. Such a conductive ink or conductive composition is formed of a metal component, an organic solvent, a reducing agent, an adhesive, and the like, and a conductor is formed by calcining after coating to enable conduction.

For example, JP 2013-134914 A discloses a conductive composition containing a thermoplastic resin and a thermosetting resin as a binder resin, a curing agent, and metal particles. WO 2017/033911 A discloses a metal paste obtained by kneading a solid content composed of silver particles and a solvent. Patent Literature 2 discloses a metal paste containing a predetermined amount of silver particles of which a particle diameter of 100 to 200 nm, and the average particle diameter of the whole silver particles is 60 to 800 nm, and high molecular weight ethyl cellulose having a number average molecular weight in a predetermined range.

JP 2013-142173 A discloses that a silver compound and a predetermined amine mixture are mixed to form a complex compound containing the silver compound and the amine, and the complex compound is heated and thermally decomposed to form silver nanoparticles. In addition, JP 2013-142173 A discloses a silver coating composition containing the silver nanoparticles and an organic solvent. JP 2000-239636 A discloses a curable conductive paste containing an epoxy resin, a curing agent, conductive powder, and a solvent. JP 2012-84440 A discloses a thermosetting conductive paste containing (A) a conductive filler, (B) a thermosetting binder, (C) a cellulose resin, and (D) an acrylonitrile-butadiene copolymer if necessary.

SUMMARY

If a resin component and an adhesive are not added to a conductive composition in a certain amount or more, adhesion of a conductor to a substrate cannot be obtained. On the other hand, when the resin component or the adhesive is added to the conductive composition in a certain amount or more, a contact point of metal particles is decreased, and thereby a specific resistance of the conductor is increased. For this reason, even when the conductive compositions in Patent Literatures 1 to 5 are used, it was difficult to obtain a conductive composition capable of obtaining a conductor having a specific resistance equivalent to that of silver bulk and having excellent adhesion to a substrate. Therefore, it is difficult to obtain a wiring board for automobile use that satisfies the adhesion required for a flexible printed wiring board and has a sufficiently small specific resistance.

The present invention has been made in view of the problems in the related art. An object of the present invention is to provide a conductive composition capable of obtaining a conductor having a specific resistance equivalent to that of silver bulk and having excellent adhesion to a substrate, and a wiring board using the conductive composition.

According to a first aspect of the present invention, there is provided a conductive composition containing metal nanoparticles having an average particle diameter of 30 nm to 600 nm, metal particles having an average particle diameter larger than that of the metal nanoparticles, a thermosetting resin having an oxirane ring in a molecule, a curing agent, and a cellulose resin, wherein a specific resistance of a conductor formed by applying and calcining the conductive composition on a substrate is $5.0 \times 10^{-6}$ Ω·cm or less, and the conductor does not peel from the substrate when a tape having an adhesive force of 3.9 N/10 mm to 39 N/10 mm is pressed against the conductor and peeled off.

According to a second aspect of the present invention, in the conductive composition relating to the conductive composition of the first aspect, the thermosetting resin is at least one selected from the group consisting of a bisphenol A type epoxy resin, a bisphenol F type epoxy resin, a novolac type epoxy resin, a glycidylamine type epoxy resin, and an aliphatic type epoxy resin.

According to a third aspect of the present invention, in the conductive composition relating to the conductive composition of the first or second aspect, the curing agent is a 5-membered heterocyclic aromatic compound containing nitrogen.

According to a fourth aspect of the present invention, in the conductive composition relating to the conductive composition of any one of the first to third aspects, a content ratio of the thermosetting resin to the curing agent is 1:1 to 4:1 by mass ratio.

According to a fifth aspect of the present invention, in the conductive composition relating to the conductive composition of any one of the first to fourth aspects, a content of the cellulose resin is 0.1% by mass to 4% by mass with respect to the entire conductive composition.

According to a sixth aspect of the present invention, in the conductive composition relating to the conductive composition of any one of the first to fifth aspects, a total content of the thermosetting resin and the curing agent is 0.1% by mass to 6% by mass with respect to the entire conductive composition.

According to a seventh aspect of the present invention, in the conductive composition relating to the conductive composition of any one of the first to sixth aspects, the total content of the thermosetting resin and the curing agent is 0.1% by mass to 5% by mass with respect to the entire conductive composition.

According to an eighth aspect of the present invention, in the conductive composition relating to the conductive composition of any one of the first to seventh aspects, the total content of the thermosetting resin and the curing agent is 0.1% by mass to 2% by mass with respect to the entire conductive composition.

The conductive composition according to a ninth aspect of the present invention relates to the conductive composition according to any one of the first to eighth aspects, an average particle diameter of the metal particles is 1 μm to 5 μm.

According to a tenth aspect of the present invention, there is provided a wiring board including a conductor obtained from the conductive composition according to any one of the first to ninth aspects.

DETAILED DESCRIPTION

[Conductive Composition]

The conductive composition of the present embodiment contains metal nanoparticles, metal particles, a thermosetting resin, a curing agent, and a cellulose resin. Hereinafter, each configuration will be described in detail.

The conductive composition of the present embodiment contains metal nanoparticles having an average particle diameter of 30 nm to 600 nm. Usually, a metal melting point decreases because the number of metal atoms present on the particle surface increases as the diameter of the metal particle decreases. Therefore, it is possible to form a conductor at a relatively low temperature by using such metal nanoparticles for the conductive composition. Further, when an average particle diameter of the metal nanoparticles is 30 nm to 600 nm, a gap between the metal particles can be filled with the metal nanoparticles. Therefore, since the metal nanoparticles and the metal particles are sintered to form a dense sintered body, the conductivity of the conductor obtained by calcining the conductive composition can be increased. Note that, the average particle diameter of the metal nanoparticles is more preferably 70 nm to 600 nm from the viewpoint of forming a denser sintered body and increasing the conductivity. In the present specification, the average particle diameter of the metal nanoparticles refers to a median diameter (50% diameter, D50) measured by a dynamic light scattering method.

The metal constituting the metal nanoparticle is not particularly limited, and is preferable to contain at least one selected from the group consisting of gold, silver, copper, platinum, palladium, rhodium, ruthenium, iridium, osmium, tungsten, nickel, tantalum, bismuth, lead, indium, tin, zinc, and titanium. Further, the metal constituting the metal nanoparticle more preferably consists of at least one selected from the group consisting of gold, silver, copper, platinum, palladium, rhodium, ruthenium, iridium, osmium, tungsten, nickel, tantalum, bismuth, lead, indium, tin, zinc, and titanium. Furthermore, it is preferable that the metal consisting of a metal nanoparticle contains at least one selected from the group which consists of gold, silver, copper, and platinum. By using such metal nanoparticles, fine wiring can be formed. Furthermore, a specific resistance value of the conductor after calcining can be reduced, and the surface smoothness of the conductor can be improved. Among these metals, it is preferable to use silver from the viewpoint of being easily reduced by calcining the conductive composition to form a dense sintered body and reducing the specific resistance of the obtained conductor.

The conductive composition according to the present embodiment contains metal particles having an average particle diameter larger than that of the metal nanoparticles in addition to the metal nanoparticles described above. By using such metal particles, the conductor after calcining can be densified and the specific resistance can be reduced.

The average particle diameter of the metal particles is preferably 1 μm to 5 μm. When the average particle diameter of the metal particles is within this range, the conductivity of the conductor can be increased. In addition, as described later, even in a case where the conductive composition is applied to an insulating substrate by a screen printing method, a fine circuit is efficiently formed due to little possibility of clogging metal particles in the screen printing mesh. Note that, in the present specification, the average particle diameter of the metal particles refers to a median diameter (50% diameter, D50) measured by a dynamic light scattering method.

Similar to the metal nanoparticle, the metal constituting the metal particle is preferable to contain at least one selected from the group consisting of gold, silver, copper, platinum, palladium, rhodium, ruthenium, iridium, osmium, tungsten, nickel, tantalum, bismuth, lead, indium, tin, zinc, and titanium. Further, the metal constituting the metal particle more preferably consists of at least one selected from the group consisting of gold, silver, copper, platinum, palladium, rhodium, ruthenium, iridium, osmium, tungsten, nickel, tantalum, bismuth, lead, indium, tin, zinc, and titanium. Furthermore, it is preferable that the metal consisting of a metal particle contains at least one selected from the group which consists of gold, silver, copper, and platinum. By using metal particles consisting of these metals, the resistance value of the conductor after calcining can be reduced, and the surface smoothness of the conductor can be improved. Among these metals, it is preferable to use silver from the viewpoint of being easily reduced by calcining the conductive composition to form a dense sintered body and reducing the specific resistance of the obtained conductor.

In the conductive composition of the present embodiment, the ratio of the metal nanoparticles to the metal particles is not particularly limited, and is preferably, for example, 1:9 to 9:1 by mass ratio. When the ratio between the metal nanoparticles and the metal particles is within this range, a conductor made of a dense sintered body and having improved conductivity can be obtained. In addition, in a case where the ratio of the metal nanoparticles is lower than this range, it may become difficult to satisfy the specific resistance of the conductor to be obtained. On the other hand, when the ratio of the metal nanoparticles is higher than this range, the viscosity of the conductive composition is lowered, and it may be difficult to satisfy the workability.

The conductive composition according to the present embodiment contains a thermosetting resin having an oxirane ring in the molecule. Oxirane, also called ethylene oxide, is 3-membered ring ether. By using such a thermosetting resin, in a case where a conductor is formed by applying and drying a conductive composition to a substrate, the adhesion between the substrate and the conductor can be improved.

The thermosetting resin having an oxirane ring in the molecule is not particularly limited, and is preferably at least one selected from the group consisting of a bisphenol A type epoxy resin, a bisphenol F type epoxy resin, a novolac type epoxy resin, a glycidylamine type epoxy resin, and an aliphatic type epoxy resin.

The curing agent is not particularly limited as long as the thermosetting resin contained in the conductive composition can be cured. For example, an imidazole curing agent, an amide curing agent, a phenol curing agent, an amine curing agent, an acid anhydride curing agent, or the like can be used. The curing agent may be used alone and may be used in combination of two or more kinds thereof.

Examples of the imidazole curing agent include imidazole, 2-methylimidazole, 2-ethylimidazole, 2-ethyl-4-methylimidazole, 2-isopropylimidazole, 2-phenylimidazole, 1-cyanoethyl-2-undecylimidazole, 1-cyano-2-phenylimidazole, 1-cyanoethyl-2-undecylimidazole trimellitate, and 1-cyanoethyl-2-phenylimidazolium trimellitate.

Examples of the amide curing agent include dicyandiamide.

Examples of the phenol curing agent include a phenol resin.

Examples of the amine curing agent include aliphatic amines such as diethylenetriamine, triethylenetetramine, tetraethylenepentamine, and N-aminoethylpiperazine, and aromatic amines such as toluenediamine, xylenediamine, diaminodiphenylmethane, phenylenediamine, and diaminodiphenylsulfone.

Examples of the acid anhydride curing agent include phthalic anhydride, trimellitic anhydride, tetrahydrophthalic anhydride, methyltetrahydrophthalic anhydride, methylhexahydrophthalic anhydride, hexahydrophthalic anhydride, and nadic anhydride.

The curing agent is preferably a 5-membered heterocyclic aromatic compound containing nitrogen. The 5-membered heterocyclic aromatic compound containing nitrogen is a heterocyclic compound containing carbon and nitrogen, having a 5-membered ring, and having aromaticity. Since such a curing agent generally has a curing start temperature of 100° C. or higher, even when a conductive composition is prepared and applied to a substrate or the like, curing does not easily start at room temperature, and the curing is easy to start after calcining. Therefore, for example, when a wiring board is manufactured, the conductive composition can be easily handled. As the curing agent of the 5-membered heterocyclic aromatic compound containing nitrogen, the imidazole curing agent is mentioned, for example.

The content ratio of the thermosetting resin to the curing agent is preferably 1:1 to 4:1 by mass ratio. By setting the content ratio of the thermosetting resin to the curing agent to be within the above range, the reactivity between the thermosetting resin and the curing agent is further improved, so that the curing of the conductive composition can be promoted. Note that, the content ratio of the thermosetting resin to the curing agent is more preferably 1:1 to 3:1 by mass ratio.

The conductive composition of the present embodiment contains a cellulose resin. By uniformly dispersing the cellulose resin in the conductive composition, it is possible to suppress the fluidity of the conductive composition from increasing and the printability of the conductive composition from decreasing. Moreover, since the thermosetting resin and the curing agent are entangled with each other by uniformly dispersing the cellulose resin in the conductive composition, the adhesion between the conductor formed by calcining the conductive composition and the substrate can be improved.

Examples of the cellulose resin include cellulose ether, cellulose ester, and cellulose ether ester, and it is preferable to use cellulose ether. Examples of the cellulose ether include cellulose single ether in which one kind of ether group is bonded to cellulose and cellulose mixed ether in which two or more kinds of ether groups are bonded to cellulose. Specific examples of the cellulose single ether include methyl cellulose, ethyl cellulose, propyl cellulose, hydroxymethyl cellulose, hydroxyethyl cellulose, hydroxypropyl cellulose, and carboxymethyl cellulose. Specific examples of the cellulose mixed ether include methyl ethyl cellulose, methyl propyl cellulose, ethyl propyl cellulose, hydroxymethyl ethyl cellulose, hydroxypropyl methyl cellulose, hydroxyethyl methyl cellulose, hydroxypropyl methyl cellulose and the like. The cellulose ether may be used alone and may be used in combination of two or more kinds thereof. Note that, a cellulose resin is preferably ethyl cellulose.

Although the content of the cellulose resin in the conductive composition is not particularly limited, it is preferable to adjust so that the printability of a conductive composition may become favorable. Specifically, the content of the cellulose resin is preferably 0.1% by mass to 4% by mass with respect to the entire conductive composition. When the content of the cellulose resin is 0.1% by mass or more, the adhesion between the conductor formed by calcining the conductive composition and the substrate can be further improved. Moreover, when content of a cellulose resin is 4% by mass or less, the fluidity of the conductive composition can be prevented from excessively rising, and the printability of the conductive composition can be improved. Further, in a case where the content of the cellulose resin is 4% by mass or less, the content of the relative metal component in the conductor increases, so that the conductivity of the conductor can be improved. The content of the cellulose resin is more preferably 0.1% by mass to 2% by mass with respect to the entire conductive composition.

The conductive composition of the present embodiment may contain an organic solvent in order to uniformly disperse the metal nanoparticles, metal particles, a thermosetting resin, a curing agent, and a cellulose resin. The organic solvent is not particularly limited as long as it can highly disperse the metal nanoparticles and metal particles and dissolve the thermosetting resin, the curing agent, and the cellulose resin.

As the organic solvent, it is preferable to use an organic solvent having 8 to 16 carbon atoms in total, a hydroxyl group, and a boiling point of 280° C. or lower. Specifically, as the organic solvent, it is possible to use at least one selected from the group consisting of diethylene glycol monoethyl ether acetate (C8, boiling point of 218° C.), terpineol (C10, boiling point of 219° C.), dihydroterpineol (010, boiling point of 220° C.), texanol (C12, boiling point of 260° C.), 2,4-dimethyl-1,5-pentadiol (C9, boiling point of 150° C.), and butyl carbitol (C8, boiling point of 230° C.). In addition, as the organic solvent, it is also possible to use at least one selected from the group consisting of isophorone (boiling point of 215° C.), ethylene glycol (boiling point of 197° C.), butyl carbitol acetate (boiling point of 247° C.), and 2,2,4-trimethyl-1,3-pentanediol diisobutyrate (C16, boiling point of 280° C.)

The additional amount of the organic solvent in the conductive composition is not particularly limited, and it is preferable to adjust the viscosity so that the conductive composition can be applied by a screen printing method or the like. Specifically, the content of the organic solvent is preferably 10% by mass to 25% by mass with respect to the entire conductive composition.

The conductive composition of the present embodiment may contain additives to improve printing characteristics and conductor characteristics of an antifoaming agent, a surfactant, a rheology modifier, and the like within a range that does not adversely affect the dispersion stability of the paste and the performance of the conductor after calcining.

In the conductive composition of the present embodiment, the specific resistance of a conductor formed by applying and calcining the conductive composition on a substrate is $5.0 \times 10^{-6}$ Ω·cm or less. By setting the specific resistance of the conductor to be such a value, the specific resistance of the conductor can be made equivalent to that of silver bulk. The specific resistance of the conductor can be measured in accordance with JIS K7194 (resistivity test method for conductive plastics by a 4-probe method). Specifically, the specific resistance of the conductor can be measured with a four-probe resistance measuring instrument.

In the conductive composition of the present embodiment, it is preferable that the conductor does not peel from the substrate when a tape having an adhesive force of 3.9 N/10 mm to 39 N/10 mm is pressed against the conductor and peeled off. Specifically, "the conductor does not peel from the substrate" means that when the tape is pressed against the conductor and peeled off, in a case where the conductor peeled off from the substrate on the tape side cannot be visually checked, or in a case where the peeling of the conductor on the wiring board side cannot be visually checked. When the conductor formed by applying and calcining the conductive composition to the substrate has such characteristics, the conductor has sufficient adhesion to the substrate, and thereby it is easy to make the wiring board smaller, thinner, and three-dimensional. The adhesive force of the tape is preferably 4.3 N/10 mm or more and 39 N/10 mm or less, and more preferably 5.3 N/10 mm or more and 38 N/10 mm or less.

As described above, the conductive composition is composed of a metal component such as metal nanoparticles and metal particles, and a resin component such as a thermosetting resin, a curing agent, and a cellulose resin. Then, the conductor is formed by calcining after applying the conductive composition to a substrate. At this time, it is preferable to add a certain amount of a resin component to the conductive composition in order to improve the adhesion between the obtained conductor and the substrate.

Here, a solder is easy to bond with metal, while being difficult to bond with resin. For this reason, the resin component may reduce the wettability between the conductor and the solder during mounting, thereby making it difficult to form a fillet shape or forming a solder ball. In such a case, a bonding strength between the conductor and the mounted component may not be satisfied.

From such a viewpoint, the total content of the thermosetting resin and the curing agent is preferably 0.1% by mass to 6% by mass with respect to the entire conductive composition. When the total content is 0.1% by mass or more, the adhesion between the conductor formed by calcining the conductive composition and the substrate can be further improved. Further, in a case where the total content is 6% by mass or less, the content of the relative metal component in the conductor increases, so that the conductivity of the conductor can be improved.

In addition, the total content of the thermosetting resin and the curing agent is more preferably 0.1% by mass to 5% by mass, further preferably 0.1% by mass to 4% by mass, and is particularly preferably 0.1% by mass to 2% by mass, with respect to the entire conductive composition. By setting the total content of the thermosetting resin and the curing agent within this range, the resin component in the obtained conductor is reduced, so that the wettability of the solder to the conductor can be improved. That is, by reducing the resin component in the entire conductive composition, the metal nanoparticles and the metal particles are easily brought into contact with each other, and sintering is promoted, so that the pores are reduced in a size to obtain a conductor having a high metal concentration. Such a conductor makes it possible to satisfy contradictory characteristics such as adhesion to a substrate and wettability of solder. In addition, since such a conductor has a small amount of flux that appears on the surface after calcining, the excellent solder wettability is possible.

As described above, the conductive composition of the present embodiment contains metal nanoparticles having an average particle diameter of 30 nm to 600 nm, metal particles having an average particle diameter larger than that of the metal nanoparticles, a thermosetting resin having an oxirane ring in the molecule, a curing agent, and a cellulose resin. Then, the specific resistance of the conductor formed by applying and calcining the conductive composition on the substrate is preferably $5.0 \times 10^{-6}$ Ω·cm or less, and the conductor does not peel from the substrate when a tape having an adhesive force of 3.9 N/10 mm to 39 N/10 mm is pressed against the conductor and peeled off. Therefore, it is possible to obtain a conductor having a specific resistance equivalent to that of silver bulk and having excellent adhesion to the substrate. Accordingly, it becomes possible to apply to the wiring board for a motor vehicle.

Moreover, the conductor formed by calcining the conductive composition of the present embodiment has excellent solder wettability. Therefore, when a component is mounted on a conductor using solder, sufficient mounting strength can be obtained.

[Wiring Board]

The wiring board according to the present embodiment includes a conductor obtained from the above-described conductive composition. As described above, the conductor obtained from the conductive composition of the present embodiment has a specific resistance of $5.0 \times 10^{-6}$ Ω·cm or less and a tape having an adhesive force of 3.9 N/10 mm to 39 N/10 mm is good, which exhibits excellent adhesion. Since the wiring board has adhesion that can withstand long-term use and can increase the amount of current flowing through the conductor, it can be suitably used for automobiles.

The wiring board of the present embodiment can be obtained by calcining the conductive composition after applying the conductive composition to a desired shape on the substrate. The substrate that can be used for the wiring board is not particularly limited, and an electrically insulating film or a plate material can be used. Such a substrate is flexible and can be bent or the like depending on the portion to be used. The material of the substrate is not particularly limited, for example, it is possible to use at least one selected from the group consisting of polyimide (PI), polyethylene terephthalate (PET), polyethylene naphthalate (PEN), polycarbonate (PC), polypropylene (PP), and polybutylene terephthalate (PBT).

A method of applying the conductive composition on the substrate is not particularly limited, and can be performed by a conventionally known method such as flexographic printing, gravure printing, gravure offset printing, offset printing, screen printing, and rotary screen printing.

A calcining method after applying the conductive composition on the substrate is also not specifically limited. For example, it is preferable to expose the substrate coated with the conductive composition to hot air of 140° C. or higher. With this, since the organic solvent or the like in the conductive composition is removed and the metal nanoparticles and the metal particles are sintered, a highly conductive conductor can be obtained. Note that, it is more preferable to expose the substrate coated with the conductive composition to hot air of 250° C. or higher. By raising the calcining temperature, the obtained sintered body becomes denser, and therefore it is possible to further reduce the resistance. Note that, the calcining method is not limited to the above-described hot-air calcining, and for example, plasma calcining, light calcining, and pulse wave calcining can also be applied.

The wiring board provided with the conductor obtained from the conductive composition may include an insulating cover material for covering and protecting the surface of the conductor. An insulating film or a resist can be used as the insulating cover material. As the insulating cover material, it is preferable to use polyethylene terephthalate (PET), polyethylene naphthalate (PEN), polycarbonate (PC), polypropylene (PP), polybutylene terephthalate (PBT), polyurethane (PU), and the like with an adhesive on one side. In addition, the resist is preferably a thermosetting resist or a UV curable resist, and particularly preferably an epoxy resist or a urethane resist.

EXAMPLES

Hereinafter, the present embodiment will be described in more detail with reference to examples and comparative examples, but the present embodiment is not limited to these examples.

Example 1

[Preparation of Conductive Composition]

First, a conductive composition of each example was prepared by stirring metal nanoparticles, metal particles, a thermosetting resin, a curing agent, a resin, and an organic solvent at a compounding ratio indicated in Tables 1 to 5 using a rotation and revolution stirrer. The materials used as raw materials of the conductive composition of each example are as follows.

(Metal Nanoparticles)

Silver nanoparticles having average particle diameters of 25 nm, 30 nm, 70 nm, 350 nm, 600 nm, and 700 nm, respectively (Metal Particles)

Silver particles having average particle diameters of 1.0 μm, 3.0 μm, 5.0 μm, and 6.0 μm, respectively (Thermosetting Resin)

Bisphenol A type epoxy resin, jER (registered trademark) 828, prepared by Mitsubishi Chemical Corporation.

Bisphenol F type epoxy resin, EPICLON (registered trademark) 830, prepared by DIC Corporation.

Aliphatic epoxy resin, PG-207GS (polypropylene glycol diglycidyl ether) prepared by NIPPON STEEL Chemical & Material Co., Ltd.

Novolac type epoxy resin, YDPN-638 (phenol Novolac type epoxy resin), prepared by NIPPON STEEL Chemical & Material Co., Ltd.

Phenolic resin, PS-2608, prepared by Gun Ei Chemical Industry Co., Ltd.

Urethane resin, UREARNO (registered trademark) KL-422, prepared by Arakawa Chemical Industries, Ltd.

(Curing Agent)

Dicyandiamide, DICY7, prepared by Mitsubishi Chemical Corporation.

Imidazole, NISSOCURE (registered trademark) TIC-188, prepared by Nippon Soda Co., Ltd.

Hexamethylenetetramine, prepared by Mitsubishi Gas Chemical Company, Inc.

Polyisocyanate, BURNOCK (registered trademark) D-750, prepared by DIC Corporation.

(Resin Component)

Hydroxyethylmethylcellulose, METOLOSE (registered trademark) SEB04T, prepared by Shin-Etsu Chemical Co., Ltd.

Ethyl cellulose, ETHOCEL (registered trademark) STD4, prepared by The Dow Chemical Company Ethyl cellulose acrylic polymer, ACRIT (registered trademark) KWE-250T, prepared by Taisei Fine Chemical Co, Ltd.

Polyamide, F-915, prepared by Tokyo Printing Ink Mfg. Co., Ltd.

Acrylic resin, ACRYDIC (registered trademark) 52-204, prepared by DIC Corporation.

(Organic Solvent)

Terpineol, prepared by Tokyo Chemical Industry Co., Ltd.

Diethylene glycol monoethyl ether acetate, prepared by Tokyo Chemical Industry Co., Ltd.

Texanol (2,2,4-trimethylpentane-1,3-diol monoisobutyrate) prepared by Eastman Chemical Company NYSE: EMN

[Evaluation]

The conductive composition of each example was evaluated as follows. These results are indicated in Tables 1 to 5, respectively.

(Specific Resistance of Conductor)

The specific resistance of the conductor was measured in accordance with JIS K7194. As a device, a four-probe resistance measuring instrument (resistivity measuring device Sigma-5+ manufactured by NPS Corporation.) was used.

Specifically, first, a circuit was printed with the conductive composition obtained in each example on a polyimide film using a screen printer so that the width was 1 mm, the length was 10 cm, and the thickness was 30 µm after calcining. Next, after the polyimide film on which the circuit was printed was allowed to stand at room temperature for 30 minutes, it was calcined with hot air at 140° C. for 30 minutes to produce a wiring board.

Next, the surface resistance of the obtained Ag thin film on the wiring board was measured at three points, 1 cm portions from both ends and a 5 cm portion at the center. Note that, the surface resistance was measured with the needle placed parallel to the circuit.

(Adhesion 1)

The adhesion of the conductive composition to the polyimide film was evaluated by a peeling test using a tape having an adhesive force of 3.9 N/10 mm to 5.7 N/10 mm.

Specifically, first, a circuit was printed with the conductive composition obtained in each example on a polyimide film using a screen printer so that the width was 1 mm, the length was 10 cm, and the thickness was 30 µm after calcining. Next, after the polyimide film on which the circuit was printed was allowed to stand at room temperature for 30 minutes, it was calcined with hot air at 140° C. for 30 minutes to produce a wiring board.

Next, the adhesive surface of the tape was pressure-bonded to the obtained wiring board with fingers so that no bubbles remained, and after about 10 seconds, the tape was quickly peeled off in a direction perpendicular to the printed surface. As a tape, an aluminum tape No. 950, manufactured by Nichiban Co., Ltd., with an adhesive force of 5.30 N/10 mm was used.

Criteria

○: No print peeling is observed (a case where the peeled circuit cannot be checked on the tape side and a case where the peeling of the circuit cannot be checked visually on the wiring board side)

X: Print peeling is observed (a case where the peeled circuit can be checked on the tape side or a case where the peeling of the circuit can be checked visually on the wiring board side)

(Bleeding)

The bleeding of printing was evaluated as follows. First, a circuit was printed with the conductive composition obtained in each example on a polyimide film using a screen printer so that the size after calcining was changed to be 1 mm in width, 10 cm in length, and 30 µm in thickness. Next, after the polyimide film on which the circuit was printed was allowed to stand at room temperature for 30 minutes, it was calcined with hot air at 140° C. for 30 minutes to produce a wiring board. Then, in the obtained wiring board, it was visually evaluated whether there was any bleeding in the printed circuit.

Criteria

○: No bleeding is observed

X: Bleeding is observed (Blur)

Printing blur was evaluated as follows. First, a circuit was printed with the conductive composition obtained in each example on a polyimide film using a screen printer so that the size after calcining was changed to be 1 mm in width, 10 cm in length, and 30 µm in thickness. Next, after the polyimide film on which the circuit was printed was allowed to stand at room temperature for 10 minutes, it was checked with a microscope whether or not there was a blur at the printing boundary, and the blur was evaluated.

Criteria

○: No blur is observed

X: Blur is observed (Sagging)

The sagging of printing was evaluated as follows. First, a circuit was printed with the conductive composition obtained in each example on a polyimide film using a screen printer so that the size after calcining was changed to be 1 mm in width, 10 cm in length, and 30 µm in thickness. Next, after the polyimide film on which the circuit was printed was allowed to stand at room temperature for 10 minutes, it was checked with a microscope whether or not a printed portion was equivalent to a transfer shape designed by a screen mask, and the sagging was evaluated.

Criteria

○: No sagging is observed

X: Sagging is observed (Mesh Mark)

The printed mesh mark was evaluated as follows. First, a circuit was printed with the conductive composition obtained in each example on a polyimide film using a screen printer so that the size after calcining was changed to be 1 mm in width, 10 cm in length, and 30 µm in thickness. Next, after the polyimide film on which the circuit was printed was allowed to stand at room temperature for 10 minutes, it was checked with a microscope whether or not there was a mesh mark on the surface of the printed portion, and the mesh mark was evaluated.

Criteria

○: No mesh mark is observed

X: Mesh mark is observed (Squeegee Sticking Properties)

The squeegee sticking properties during printing was evaluated as follows. First, three sheets of the circuit were printed with the conductive composition obtained in each example on a polyimide film using a screen printer so that the size after calcining was changed to be 1 mm in width, 10 cm in length, and 30 µm in thickness. The squeegee was raised after printing, and a state of adhesion of the conductive composition to the squeegee was evaluated.

Criteria

◉: A case where there is no adhesion of heavy conductive composition on squeegee ○: A case where there is adhesion of heavy conductive composition on squeegee, but falls within 5 seconds X: A case where there is adhesion of heavy conductive composition on squeegee, and does not come off at all

TABLE 1

| CONSTITUENT MATERIAL | MATERIAL SPECIFICATION | EXAMPLE 1-1 | EXAMPLE 1-2 | EXAMPLE 1-3 | EXAMPLE 1-4 | EXAMPLE 1-5 |
|---|---|---|---|---|---|---|
| SILVER NANOPARTICLE (PARTS BY MASS) | 25 nm | — | — | — | — | — |
| | 30 nm | — | — | — | — | — |
| | 70 nm | 40 | — | — | 20 | — |
| | 350 nm | — | 40 | — | — | 30 |
| | 600 nm | — | — | 40 | — | — |
| | 700 nm | — | — | — | — | — |
| SILVER PARTICLE (PARTS BY MASS) | 1.0 μm | 40 | — | — | 60 | — |
| | 3.0 μm | — | 40 | — | — | 50 |
| | 5.0 μm | — | — | 40 | — | — |
| | 6.0 μm | — | — | — | — | — |
| THERMOSETTING RESIN (PARTS BY MASS) | BISPHENOL A TYPE EPOXY RESIN | 0.1 | — | — | — | — |
| | BISPHENOL F TYPE EPOXY RESIN | — | 3 | — | — | — |
| | ALIPHATIC EPOXY RESIN | — | — | 3.2 | — | — |
| | NOVOLAC TYPE EPOXY RESIN | — | — | — | 1.5 | 2.4 |
| | PHENOLIC RESIN | — | — | — | — | — |
| | URETHANE RESIN | — | — | — | — | — |
| CURING AGENT (PARTS BY MASS) | DICYANDIAMIDE | 0.1 | — | 0.8 | — | — |
| | IMIDAZOLE | — | 1 | — | 0.75 | 0.8 |
| | HEXAMETHYLENETETRAMINE | — | — | — | — | — |
| | POLYISOCYANATE | — | — | — | — | — |
| RESIN COMPONENT (PARTS BY MASS) | HYDROXYETHYLMETHYLCELLULOSE | 0.1 | — | 4 | — | — |
| | ETHYL CELLULOSE | — | 2 | — | — | 3 |
| | ETHYL CELLULOSE ACRYLIC POLYMER | — | — | — | 2 | — |
| | POLYAMIDE | — | — | — | — | — |
| | ACRYLIC RESIN | — | — | — | — | — |
| ORGANIC SOLVENT (PARTS BY MASS) | TERPINEOL | 19.7 | — | — | 15.75 | — |
| | DIETHYLENE GLYCOL MONOETHYL ETHER ACETATE | — | 14 | — | — | 13.8 |
| | TEXANOL | — | — | 12 | — | — |
| CHARACTERISTICS | SPECIFIC RESISTANCE(Ω · cm) | $3.1 \times 10^{-6}$ | $4.5 \times 10^{-6}$ | $4.2 \times 10^{-6}$ | $4.2 \times 10^{-6}$ | $4.9 \times 10^{-6}$ |
| | ADHESION 1 | ○ | ○ | ○ | ○ | ○ |
| PRINTING CHARACTERISTICS | BLEEDING | ○ | ○ | ○ | ○ | ○ |
| | BLUR | ○ | ○ | ○ | ○ | ○ |
| | SAGGING | ○ | ○ | ○ | ○ | ○ |
| | MESH MARK | ○ | ○ | ○ | ○ | ○ |
| | SQUEEGEE STICKING PROPERTIES | ◎ | ◎ | ○ | ◎ | ○ |

TABLE 2

| CONSTITUENT MATERIAL | MATERIAL SPECIFICATION | EXAMPLE 1-6 | EXAMPLE 1-7 | EXAMPLE 1-8 | EXAMPLE 1-9 | EXAMPLE 1-10 |
|---|---|---|---|---|---|---|
| SILVER NANOPARTICLE (PARTS BY MASS) | 25 nm | — | — | — | — | — |
| | 30 nm | — | — | — | 10 | 35 |
| | 70 nm | — | 55 | — | — | — |
| | 350 nm | — | — | 65 | — | — |
| | 600 nm | 50 | — | — | — | — |
| | 700 nm | — | — | — | — | — |
| SILVER PARTICLE (PARTS BY MASS) | 1.0 μm | — | — | 20 | 70 | 45 |
| | 3.0 μm | — | 20 | — | — | — |
| | 5.0 μm | 30 | — | — | — | — |
| | 6.0 μm | — | — | — | — | — |
| THERMOSETTING RESIN (PARTS BY MASS) | BISPHENOL A TYPE EPOXY RESIN | — | — | 0.5 | — | — |
| | BISPHENOL F TYPE EPOXY RESIN | — | 2 | — | 0.1 | — |
| | ALIPHATIC EPOXY RESIN | 1 | — | — | — | — |
| | NOVOLAC TYPE EPOXY RESIN | — | — | — | — | 0.1 |
| | PHENOLIC RESIN | — | — | — | — | — |
| | URETHANE RESIN | — | — | — | — | — |
| CURING AGENT (PARTS BY MASS) | DICYANDIAMIDE | — | 1 | 0.5 | — | — |
| | IMIDAZOLE | 1 | — | — | 0.1 | 0.1 |
| | HEXAMETHYLENETETRAMINE | — | — | — | — | — |
| | POLYISOCYANATE | — | — | — | — | — |
| RESIN COMPONENT (PARTS BY MASS) | HYDROXYETHYLMETHYLCELLULOSE | — | — | — | — | — |
| | ETHYL CELLULOSE | — | — | 2 | 1 | 1 |
| | ETHYL CELLULOSE ACRYLIC POLYMER | 1.5 | 1 | 1 | — | — |
| | POLYAMIDE | — | — | — | — | — |
| | ACRYLIC RESIN | — | — | — | — | — |
| ORGANIC SOLVENT (PARTS BY MASS) | TERPINEOL | — | 21 | 11 | — | — |
| | DIETHYLENE GLYCOL MONOETHYL ETHER ACETATE | — | — | — | — | — |
| | TEXANOL | 16.5 | — | — | 18.8 | 18.8 |

TABLE 2-continued

| CONSTITUENT MATERIAL | MATERIAL SPECIFICATION | EXAMPLE 1-6 | EXAMPLE 1-7 | EXAMPLE 1-8 | EXAMPLE 1-9 | EXAMPLE 1-10 |
|---|---|---|---|---|---|---|
| CHARACTERISTICS | SPECIFIC RESISTANCE($\Omega \cdot cm$) | $3.5 \times 10^{-6}$ | $4.5 \times 10^{-6}$ | $3.5 \times 10^{-6}$ | $3.8 \times 10^{-6}$ | $4.1 \times 10^{-6}$ |
| | ADHESION 1 | ○ | ○ | ○ | ○ | ○ |
| PRINTING CHARACTERISTICS | BLEEDING | ○ | ○ | ○ | ○ | ○ |
| | BLUR | ○ | ○ | ○ | ○ | ○ |
| | SAGGING | ○ | ○ | ○ | ○ | ○ |
| | MESH MARK | ○ | ○ | ○ | ○ | ○ |
| | SQUEEGEE STICKING PROPERTIES | ◎ | ○ | ○ | ○ | ○ |

TABLE 3

| CONSTITUENT MATERIAL | MATERIAL SPECIFICATION | COMPARATIVE EXAMPLE 1-1 | COMPARATIVE EXAMPLE 1-2 | COMPARATIVE EXAMPLE 1-3 | COMPARATIVE EXAMPLE 1-4 |
|---|---|---|---|---|---|
| SILVER NANOPARTICLE (PARTS BY MASS) | 25 nm | — | — | — | — |
| | 30 nm | — | — | — | — |
| | 70 nm | — | — | 50 | 40 |
| | 350 nm | — | 60 | — | — |
| | 600 nm | 60 | — | — | — |
| | 700 nm | — | — | — | — |
| SILVER PARTICLE (PARTS BY MASS) | 1.0 μm | — | — | 30 | 40 |
| | 3.0 μm | 20 | 20 | — | — |
| | 5.0 μm | — | — | — | — |
| | 6.0 μm | — | — | — | — |
| THERMOSETTING RESIN (PARTS BY MASS) | BISPHENOL A TYPE EPOXY RESIN | — | — | — | — |
| | BISPHENOL F TYPE EPOXY RESIN | — | — | — | — |
| | ALIPHATIC EPOXY RESIN | 4 | 2 | 1 | 1 |
| | NOVOLAC TYPE EPOXY RESIN | — | — | — | — |
| | PHENOLIC RESIN | — | — | — | — |
| | URETHANE RESIN | — | — | — | — |
| CURING AGENT (PARTS BY MASS) | DICYANDIAMIDE | — | — | — | — |
| | IMIDAZOLE | 1 | 0.3 | 0.25 | 0.25 |
| | HEXAMETHYLENETETRAMINE | — | — | — | — |
| | POLYISOCYANATE | — | — | — | — |
| RESIN COMPONENT (PARTS BY MASS) | HYDROXYETHYLMETHYLCELLULOSE | — | — | — | — |
| | ETHYL CELLULOSE | 1 | 1 | 0.05 | 4.5 |
| | ETHYL CELLULOSE ACRYLIC POLYMER | — | — | — | — |
| | POLYAMIDE | — | — | — | — |
| | ACRYLIC RESIN | — | — | — | — |
| ORGANIC SOLVENT (PARTS BY MASS) | TERPINEOL | — | — | — | — |
| | DIETHYLENE GLYCOL MONOETHYL ETHER ACETATE | — | — | 18.75 | 18.75 |
| | TEXANOL | 15 | 17.7 | — | — |
| CHARACTERISTICS | SPECIFIC RESISTANCE($\Omega \cdot cm$) | $9.0 \times 10^{-6}$ | $4.4 \times 10^{-6}$ | $3.9 \times 10^{-6}$ | $1.1 \times 10^{-5}$ |
| | ADHESION 1 | ○ | X | X | X |
| PRINTING CHARACTERISTICS | BLEEDING | ○ | ○ | ○ | X |
| | BLUR | ○ | X | X | ○ |
| | SAGGING | ○ | ○ | X | ○ |
| | MESH MARK | ○ | ○ | ○ | ○ |
| | SQUEEGEE STICKING PROPERTIES | ○ | ○ | X | X |

TABLE 4

| CONSTITUENT MATERIAL | MATERIAL SPECIFICATION | COMPARATIVE EXAMPLE 1-5 | COMPARATIVE EXAMPLE 1-6 | COMPARATIVE EXAMPLE 1-7 | COMPARATIVE EXAMPLE 1-8 | COMPARATIVE EXAMPLE 1-9 |
|---|---|---|---|---|---|---|
| SILVER NANOPARTICLE (PARTS BY MASS) | 25 nm | — | 20 | — | — | — |
| | 30 nm | — | — | — | — | — |
| | 70 nm | — | — | 50 | 40 | — |
| | 350 nm | — | — | — | — | 20 |
| | 600 nm | — | — | — | — | — |
| | 700 nm | 20 | — | — | — | — |
| SILVER PARTICLE (PARTS BY MASS) | 1.0 μm | 60 | 60 | — | 40 | — |
| | 3.0 μm | — | — | — | — | 60 |
| | 5.0 μm | — | — | — | — | — |
| | 6.0 μm | — | — | 30 | — | — |

TABLE 4-continued

| CONSTITUENT MATERIAL | MATERIAL SPECIFICATION | COMPARATIVE EXAMPLE 1-5 | COMPARATIVE EXAMPLE 1-6 | COMPARATIVE EXAMPLE 1-7 | COMPARATIVE EXAMPLE 1-8 | COMPARATIVE EXAMPLE 1-9 |
|---|---|---|---|---|---|---|
| THERMOSETTING RESIN (PARTS BY MASS) | BISPHENOL A TYPE EPOXY RESIN | — | — | — | — | — |
| | BISPHENOL F TYPE EPOXY RESIN | — | — | — | — | — |
| | ALIPHATIC EPOXY RESIN | 1 | 1 | 3 | — | — |
| | NOVOLAC TYPE EPOXY RESIN | — | — | — | — | — |
| | PHENOLIC RESIN | — | — | — | 2 | — |
| | URETHANE RESIN | — | — | — | — | 2 |
| CURING AGENT (PARTS BY MASS) | DICYANDIAMIDE | — | — | — | — | — |
| | IMIDAZOLE | 0.25 | 0.25 | 0.2 | — | — |
| | HEXAMETHYLENETETRAMINE | — | — | — | 2 | — |
| | POLYISOCYANATE | — | — | — | — | 2 |
| RESIN COMPONENT (PARTS BY MASS) | HYDROXYETHYLMETHYLCELLULOSE | 1 | 1 | — | 1 | — |
| | ETHYL CELLULOSE | — | — | 1.5 | — | 1 |
| | ETHYL CELLULOSE ACRYLIC POLYMER | — | — | — | — | — |
| | POLYAMIDE | — | — | — | — | — |
| | ACRYLIC RESIN | — | — | — | — | — |
| ORGANIC SOLVENT (PARTS BY MASS) | TERPINEOL | — | — | — | — | — |
| | DIETHYLENE GLYCOL MONOETHYL ETHER ACETATE | 18.75 | 18.75 | 16.8 | 16 | — |
| | TEXANOL | — | — | — | — | 16 |
| CHARACTERISTICS | SPECIFIC RESISTANCE(Ω · cm) | $2.1 \times 10^{-5}$ | $1.6 \times 10^{-5}$ | $4.5 \times 10^{-5}$ | $3.9 \times 10^{-5}$ | $3.4 \times 10^{-5}$ |
| | ADHESION 1 | X | ◯ | ◯ | X | ◯ |
| PRINTING CHARACTERISTICS | BLEEDING | ◯ | X | X | ◯ | ◯ |
| | BLUR | ◯ | ◯ | X | ◯ | ◯ |
| | SAGGING | ◯ | ◯ | X | ◯ | X |
| | MESH MARK | ◯ | ◯ | X | ◯ | ◯ |
| | SQUEEGEE STICKING PROPERTIES | ◯ | X | ◯ | ◯ | ◯ |

TABLE 5

| CONSTITUENT MATERIAL | MATERIAL SPECIFICATION | COMPARATIVE EXAMPLE 1-10 | COMPARATIVE EXAMPLE 1-11 | COMPARATIVE EXAMPLE 1-12 | COMPARATIVE EXAMPLE 1-13 |
|---|---|---|---|---|---|
| SILVER NANOPARTICLE (PARTS BY MASS) | 25 nm | — | — | — | — |
| | 30 nm | — | — | — | — |
| | 70 nm | — | — | — | — |
| | 350 nm | 30 | 30 | — | — |
| | 600 nm | — | — | 40 | 40 |
| | 700 nm | — | — | — | — |
| SILVER PARTICLE (PARTS BY MASS) | 1.0 μm | — | — | — | — |
| | 3.0 μm | — | — | — | — |
| | 5.0 μm | 50 | 50 | 40 | 40 |
| | 6.0 μm | — | — | — | — |
| THERMOSETTING RESIN (PARTS BY MASS) | BISPHENOL A TYPE EPOXY RESIN | — | — | — | — |
| | BISPHENOL F TYPE EPOXY RESIN | — | — | — | — |
| | ALIPHATIC EPOXY RESIN | 2 | 2 | 2 | 2 |
| | NOVOLAC TYPE EPOXY RESIN | — | — | — | — |
| | PHENOLIC RESIN | — | — | — | — |
| | URETHANE RESIN | — | — | — | — |
| CURING AGENT (PARTS BY MASS) | DICYANDIAMIDE | — | — | — | — |
| | IMIDAZOLE | 1 | 1 | 1 | 1 |
| | HEXAMETHYLENETETRAMINE | — | — | — | — |
| | POLYISOCYANATE | — | — | — | — |
| RESIN COMPONENT (PARTS BY MASS) | HYDROXYETHYLMETHYLCELLULOSE | — | — | — | — |
| | ETHYL CELLULOSE | — | — | — | — |
| | ETHYL CELLULOSE ACRYLIC POLYMER | — | — | — | — |
| | POLYAMIDE | 3 | 1 | — | — |
| | ACRYLIC RESIN | — | — | 3 | 1 |
| ORGANIC SOLVENT (PARTS BY MASS) | TERPINEOL | — | — | — | — |
| | DIETHYLENE GLYCOL MONOETHYL ETHER ACETATE | 17 | 17 | — | — |
| | TEXANOL | — | — | 17 | 17 |
| CHARACTERISTICS | SPECIFIC RESISTANCE(Ω · cm) | $7.7 \times 10^{-5}$ | $8.1 \times 10^{-6}$ | $5.6 \times 10^{-5}$ | $7.7 \times 10^{-6}$ |
| | ADHESION 1 | ◯ | X | ◯ | ◯ |
| PRINTING CHARACTERISTICS | BLEEDING | X | X | X | ◯ |
| | BLUR | X | X | X | X |
| | SAGGING | X | X | X | X |
| | MESH MARK | X | ◯ | ◯ | ◯ |
| | SQUEEGEE STICKING PROPERTIES | X | X | X | ◯ |

As indicated in Table 1 and Table 2, in the wiring boards formed of the conductive compositions of Examples 1-1 to 1-10, the specific resistance of the conductor is small and the adhesion of the conductor to the substrate is also excellent. On the other hand, as indicated in Table 3 to Table 5, in the wiring boards formed of the conductive compositions of Comparative Examples 1-1 to 1-13, the specific resistance of the conductor is large or the adhesion of the conductor to the substrate is not excellent.

Example 2

[Preparation of Conductive Composition]

First, a conductive composition of each example was prepared by stirring metal nanoparticles, metal particles, a thermosetting resin, a curing agent, a resin, and an organic solvent at a compounding ratio indicated in Tables 6 to 10 using a rotation and revolution stirrer. The same material as that used in Example 1 was used as the raw material for the conductive composition in each example. The conductive compositions of Comparative Examples 2-2, 2-4 to 2-6, and 2-8 to 2-13 have the same compositions as those of Comparative Examples 1-2, 1-4 to 1-6, and 1-8 to 1-13, respectively.

TABLE 6

| CONSTITUENT MATERIAL | MATERIAL SPECIFICATION | EXAMPLE 2-1 | EXAMPLE 2-2 | EXAMPLE 2-3 | EXAMPLE 2-4 | EXAMPLE 2-5 |
|---|---|---|---|---|---|---|
| SILVER NANOPARTICLE (PARTS BY MASS) | 25 nm | — | — | — | — | — |
| | 30 nm | — | — | — | — | — |
| | 70 nm | 40 | — | — | 20 | — |
| | 350 nm | — | 40 | — | — | 30 |
| | 600 nm | — | — | 40 | — | — |
| | 700 nm | — | — | — | — | — |
| SILVER PARTICLE (PARTS BY MASS) | 1.0 μm | 40 | — | — | 60 | — |
| | 3.0 μm | — | 40 | — | — | 50 |
| | 5.0 μm | — | — | 40 | — | — |
| | 6.0 μm | — | — | — | — | — |
| THERMOSETTING RESIN (PARTS BY MASS) | BISPHENOL A TYPE EPOXY RESIN | 0.05 | — | — | — | — |
| | BISPHENOL F TYPE EPOXY RESIN | — | 4.5 | — | — | — |
| | ALIPHATIC EPOXY RESIN | — | — | 4.8 | — | — |
| | NOVOLAC TYPE EPOXY RESIN | — | — | — | 2.7 | 4.1 |
| | PHENOLIC RESIN | — | — | — | — | — |
| | URETHANE RESIN | — | — | — | — | — |
| CURING AGENT (PARTS BY MASS) | DICYANDIAMIDE | — | — | 1.2 | — | — |
| | IMIDAZOLE | 0.05 | 1.5 | — | 1.3 | 1.4 |
| | HEXAMETHYLENETETRAMINE | — | — | — | — | — |
| | POLYISOCYANATE | — | — | — | — | — |
| RESIN COMPONENT (PARTS BY MASS) | HYDROXYETHYLMETHYLCELLULOSE | 0.1 | — | 4 | — | — |
| | ETHYL CELLULOSE | — | 2 | — | — | 3 |
| | ETHYL CELLULOSE ACRYLIC POLYMER | — | — | — | 2 | — |
| | POLYAMIDE | — | — | — | — | — |
| | ACRYLIC RESIN | — | — | — | — | — |
| ORGANIC SOLVENT (PARTS BY MASS) | TERPINEOL | 19.9 | — | — | 16 | — |
| | DIETHYLENE GLYCOL MONOETHYL ETHER ACETATE | — | 12 | — | — | 11.5 |
| | TEXANOL | — | — | 10 | — | — |
| CHARACTERISTICS | SPECIFIC RESISTANCE(Ω·cm) | $2.5 \times 10^{-6}$ | $4.9 \times 10^{-6}$ | $4.5 \times 10^{-6}$ | $4.9 \times 10^{-6}$ | $4.1 \times 10^{-6}$ |
| | ADHESION 1 | ○ | ○ | ○ | ○ | ○ |
| | ADHESION 2 | ○ | ○ | ○ | ○ | ○ |
| PRINTING CHARACTERISTICS | BLEEDING | ○ | ○ | ○ | ○ | ○ |
| | BLUR | ○ | ○ | ○ | ○ | ○ |
| | SAGGING | ○ | ○ | ○ | ○ | ○ |
| | MESH MARK | ○ | ○ | ○ | ○ | ○ |
| | SQUEEGEE STICKING PROPERTIES | ◎ | ◎ | ○ | ◎ | ○ |
| MOUNTING PROPERTIES | SOLDER WETTABILITY | ○ | ○ | ○ | ○ | ○ |
| | MOUNTING STRENGTH | ◎ | ○ | ○ | ◎ | ○ |

TABLE 7

| CONSTITUENT MATERIAL | MATERIAL SPECIFICATION | EXAMPLE 2-6 | EXAMPLE 2-7 | EXAMPLE 2-8 | EXAMPLE 2-9 | EXAMPLE 2-10 |
|---|---|---|---|---|---|---|
| SILVER NANOPARTICLE (PARTS BY MASS) | 25 nm | — | — | — | — | — |
| | 30 nm | — | — | — | 10 | 35 |
| | 70 nm | — | 55 | — | — | — |
| | 350 nm | — | — | 65 | — | — |
| | 600 nm | 50 | — | — | — | — |
| | 700 nm | — | — | — | — | — |
| SILVER PARTICLE (PARTS BY MASS) | 1.0 μm | — | — | 20 | 70 | 45 |
| | 3.0 μm | — | 20 | — | — | — |
| | 5.0 μm | 30 | — | — | — | — |
| | 6.0 μm | — | — | — | — | — |

TABLE 7-continued

| CONSTITUENT MATERIAL | MATERIAL SPECIFICATION | EXAMPLE 2-6 | EXAMPLE 2-7 | EXAMPLE 2-8 | EXAMPLE 2-9 | EXAMPLE 2-10 |
|---|---|---|---|---|---|---|
| THERMOSETTING RESIN (PARTS BY MASS) | BISPHENOL A TYPE EPOXY RESIN | — | — | 1 | — | — |
| | BISPHENOL F TYPE EPOXY RESIN | — | 3.3 | — | 0.15 | — |
| | ALIPHATIC EPOXY RESIN | 2 | — | — | — | — |
| | NOVOLAC TYPE EPOXY RESIN | — | — | — | — | 0.5 |
| | PHENOLIC RESIN | — | — | — | — | — |
| | URETHANE RESIN | — | — | — | — | — |
| CURING AGENT (PARTS BY MASS) | DICYANDIAMIDE | — | 1.7 | 1 | — | — |
| | IMIDAZOLE | 2 | — | — | 0.15 | 0.5 |
| | HEXAMETHYLENETETRAMINE | — | — | — | — | — |
| | POLYISOCYANATE | — | — | — | — | — |
| RESIN COMPONENT (PARTS BY MASS) | HYDROXYETHYLMETHYLCELLULOSE | — | — | — | — | — |
| | ETHYL CELLULOSE | — | — | 2 | 1 | 1 |
| | ETHYL CELLULOSE ACRYLIC POLYMER | 1.5 | 1 | 1 | — | — |
| | POLYAMIDE | — | — | — | — | — |
| | ACRYLIC RESIN | — | — | — | — | — |
| ORGANIC SOLVENT (PARTS BY MASS) | TERPINEOL | — | 19 | 10 | — | — |
| | DIETHYLENE GLYCOL MONOETHYL ETHER ACETATE | — | — | — | — | — |
| | TEXANOL | 14.5 | — | — | 18.7 | 18 |
| CHARACTERISTICS | SPECIFIC RESISTANCE($\Omega \cdot$ cm) | $4.1 \times 10^{-6}$ | $4.5 \times 10^{-6}$ | $3.5 \times 10^{-6}$ | $3.2 \times 10^{-6}$ | $3.1 \times 10^{-6}$ |
| | ADHESION 1 | ○ | ○ | ○ | ○ | ○ |
| | ADHESION 2 | ○ | ○ | ○ | ○ | ○ |
| PRINTING CHARACTERISTICS | BLEEDING | ○ | ○ | ○ | ○ | ○ |
| | BLUR | ○ | ○ | ○ | ○ | ○ |
| | SAGGING | ○ | ○ | ○ | ○ | ○ |
| | MESH MARK | ○ | ○ | ○ | ○ | ○ |
| | SQUEEGEE STICKING PROPERTIES | ◎ | ○ | ○ | ○ | ○ |
| MOUNTING PROPERTIES | SOLDER WETTABILITY | ○ | ○ | ○ | ○ | ○ |
| | MOUNTING STRENGTH | ◎ | ◎ | ◎ | ◎ | ◎ |

TABLE 8

| CONSTITUENT MATERIAL | MATERIAL SPECIFICATION | COMPARATIVE EXAMPLE 2-1 | COMPARATIVE EXAMPLE 2-2 | COMPARATIVE EXAMPLE 2-3 | COMPARATIVE EXAMPLE 2-4 |
|---|---|---|---|---|---|
| SILVER NANOPARTICLE (PARTS BY MASS) | 25 nm | — | — | — | — |
| | 30 nm | — | — | — | — |
| | 70 nm | — | — | 50 | 40 |
| | 350 nm | — | 60 | — | — |
| | 600 nm | 60 | — | — | — |
| | 700 nm | — | — | — | — |
| SILVER PARTICLE (PARTS BY MASS) | 1.0 μm | — | — | 30 | 40 |
| | 3.0 μm | 20 | 20 | — | — |
| | 5.0 μm | — | — | — | — |
| | 6.0 μm | — | — | — | — |
| THERMOSETTING RESIN (PARTS BY MASS) | BISPHENOL A TYPE EPOXY RESIN | — | — | — | — |
| | BISPHENOL F TYPE EPOXY RESIN | — | — | — | — |
| | ALIPHATIC EPOXY RESIN | 5.6 | 2 | 5.5 | 1 |
| | NOVOLAC TYPE EPOXY RESIN | — | — | — | — |
| | PHENOLIC RESIN | — | — | — | — |
| | URETHANE RESIN | — | — | — | — |
| CURING AGENT (PARTS BY MASS) | DICYANDIAMIDE | — | — | — | — |
| | IMIDAZOLE | 1.4 | 0.3 | 1.3 | 0.25 |
| | HEXAMETHYLENETETRAMINE | — | — | — | — |
| | POLYISOCYANATE | — | — | — | — |
| RESIN COMPONENT (PARTS BY MASS) | HYDROXYETHYLMETHYLCELLULOSE | — | — | — | — |
| | ETHYL CELLULOSE | 1 | 1 | 0.05 | 4.5 |
| | ETHYL CELLULOSE ACRYLIC POLYMER | — | — | — | — |
| | POLYAMIDE | — | — | — | — |
| | ACRYLIC RESIN | — | — | — | — |
| ORGANIC SOLVENT (PARTS BY MASS) | TERPINEOL | — | — | — | — |
| | DIETHYLENE GLYCOL MONOETHYL ETHER ACETATE | — | — | 13.2 | 18.75 |
| | TEXANOL | 13 | 17.7 | — | — |
| CHARACTERISTICS | SPECIFIC RESISTANCE($\Omega \cdot$ cm) | $9.0 \times 10^{-5}$ | $4.4 \times 10^{-6}$ | $7.9 \times 10^{-5}$ | $1.1 \times 10^{-5}$ |
| | ADHESION 1 | ○ | X | ○ | X |
| | ADHESION 2 | ○ | X | ○ | X |
| PRINTING CHARACTERISTICS | BLEEDING | ○ | ○ | ○ | X |
| | BLUR | ○ | X | X | ○ |
| | SAGGING | ○ | ○ | X | ○ |
| | MESH MARK | ○ | ○ | ○ | ○ |
| | SQUEEGEE STICKING PROPERTIES | ○ | ○ | X | X |

TABLE 8-continued

| CONSTITUENT MATERIAL | MATERIAL SPECIFICATION | COMPARATIVE EXAMPLE 2-1 | COMPARATIVE EXAMPLE 2-2 | COMPARATIVE EXAMPLE 2-3 | COMPARATIVE EXAMPLE 2-4 |
|---|---|---|---|---|---|
| MOUNTING PROPERTIES | SOLDER WETTABILITY | X | ◯ | X | ◯ |
|  | MOUNTING STRENGTH | X | — | X | — |

TABLE 9

| CONSTITUENT MATERIAL | MATERIAL SPECIFICATION | COMPARATIVE EXAMPLE 2-5 | COMPARATIVE EXAMPLE 2-6 | COMPARATIVE EXAMPLE 2-7 | COMPARATIVE EXAMPLE 2-8 | COMPARATIVE EXAMPLE 2-9 |
|---|---|---|---|---|---|---|
| SILVER NANOPARTICLE (PARTS BY MASS) | 25 nm | — | 20 | — | — | — |
|  | 30 nm | — | — | — | — | — |
|  | 70 nm | — | — | 50 | 40 | — |
|  | 350 nm | — | — | — | — | — |
|  | 600 nm | — | — | — | — | — |
|  | 700 nm | 20 | — | — | — | 20 |
| SILVER PARTICLE (PARTS BY MASS) | 1.0 μm | 60 | 60 | — | 40 | — |
|  | 3.0 μm | — | — | — | — | 60 |
|  | 5.0 μm | — | — | — | — | — |
|  | 6.0 μm | — | — | 30 | — | — |
| THERMOSETTING RESIN (PARTS BY MASS) | BISPHENOL A TYPE EPOXY RESIN | — | — | — | — | — |
|  | BISPHENOL F TYPE EPOXY RESIN | — | — | — | — | — |
|  | ALIPHATIC EPOXY RESIN | 1 | 1 | 5.1 | — | — |
|  | NOVOLAC TYPE EPOXY RESIN | — | — | — | — | — |
|  | PHENOLIC RESIN | — | — | — | 2 | — |
|  | URETHANE RESIN | — | — | — | — | 2 |
| CURING AGENT (PARTS BY MASS) | DICYANDIAMIDE | — | — | — | — | — |
|  | IMIDAZOLE | 0.25 | 0.25 | 0.34 | — | — |
|  | HEXAMETHYLENETETRAMINE | — | — | — | 2 | — |
|  | POLYISOCYANATE | — | — | — | — | 2 |
| RESIN COMPONENT (PARTS BY MASS) | HYDROXYETHYLMETHYLCELLULOSE | 1 | 1 | — | 1 | — |
|  | ETHYL CELLULOSE | — | — | 1.5 | — | — |
|  | ETHYL CELLULOSE ACRYLIC POLYMER | — | — | — | — | — |
|  | POLYAMIDE | — | — | — | — | — |
|  | ACRYLIC RESIN | — | — | — | — | — |
| ORGANIC SOLVENT (PARTS BY MASS) | TERPINEOL | — | — | — | — | — |
|  | DIETHYLENE GLYCOL MONOETHYL ETHER ACETATE | 18.75 | 18.75 | 14.56 | 16 | — |
|  | TEXANOL | — | — | — | — | 16 |
| CHARACTERISTICS | SPECIFIC RESISTANCE(Ω · cm) | $2.1 \times 10^{-5}$ | $1.6 \times 10^{-5}$ | $8.2 \times 10^{-5}$ | $3.9 \times 10^{-5}$ | $3.4 \times 10^{-5}$ |
|  | ADHESION 1 | X | ◯ | ◯ | X | ◯ |
|  | ADHESION 2 | X | X | ◯ | X | X |
| PRINTING CHARACTERISTICS | BLEEDING | ◯ | X | X | ◯ | ◯ |
|  | BLUR | ◯ | ◯ | X | ◯ | ◯ |
|  | SAGGING | ◯ | ◯ | X | ◯ | X |
|  | MESH MARK | ◯ | ◯ | X | ◯ | ◯ |
|  | SQUEEGEE STICKING PROPERTIES | ◯ | X | ◯ | ◯ | ◯ |
| MOUNTING PROPERTIES | SOLDER WETTABILITY | ◯ | ◯ | ◯ | ◯ | ◯ |
|  | MOUNTING STRENGTH | — | ◉ | ◯ | — | ◯ |

TABLE 10

| CONSTITUENT MATERIAL | MATERIAL SPECIFICATION | COMPARATIVE EXAMPLE 2-10 | COMPARATIVE EXAMPLE 2-11 | COMPARATIVE EXAMPLE 2-12 | COMPARATIVE EXAMPLE 2-13 |
|---|---|---|---|---|---|
| SILVER NANOPARTICLE (PARTS BY MASS) | 25 nm | — | — | — | — |
|  | 30 nm | — | — | — | — |
|  | 70 nm | — | — | — | — |
|  | 350 nm | 30 | 30 | — | — |
|  | 600 nm | — | — | 40 | 40 |
|  | 700 nm | — | — | — | — |
| SILVER PARTICLE (PARTS BY MASS) | 1.0 μm | — | — | — | — |
|  | 3.0 μm | — | — | — | — |
|  | 5.0 μm | 50 | 50 | 40 | 40 |
|  | 6.0 μm | — | — | — | — |

TABLE 10-continued

| CONSTITUENT MATERIAL | MATERIAL SPECIFICATION | COMPARATIVE EXAMPLE 2-10 | COMPARATIVE EXAMPLE 2-11 | COMPARATIVE EXAMPLE 2-12 | COMPARATIVE EXAMPLE 2-13 |
|---|---|---|---|---|---|
| THERMOSETTING RESIN (PARTS BY MASS) | BISPHENOL A TYPE EPOXY RESIN | — | — | — | — |
| | BISPHENOL F TYPE EPOXY RESIN | — | — | — | — |
| | ALIPHATIC EPOXY RESIN | 2 | 2 | 2 | 2 |
| | NOVOLAC TYPE EPOXY RESIN | — | — | — | — |
| | PHENOLIC RESIN | — | — | — | — |
| | URETHANE RESIN | — | — | — | — |
| CURING AGENT (PARTS BY MASS) | DICYANDIAMIDE | — | — | — | — |
| | IMIDAZOLE | 1 | 1 | 1 | 1 |
| | HEXAMETHYLENETETRAMINE | — | — | — | — |
| | POLYISOCYANATE | — | — | — | — |
| RESIN COMPONENT (PARTS BY MASS) | HYDROXYETHYLMETHYLCELLULOSE | — | — | — | — |
| | ETHYL CELLULOSE | — | — | — | — |
| | ETHYL CELLULOSE ACRYLIC POLYMER | — | — | — | — |
| | POLYAMIDE | 3 | 1 | — | — |
| | ACRYLIC RESIN | — | — | 3 | 1 |
| ORGANIC SOLVENT (PARTS BY MASS) | TERPINEOL | — | — | — | — |
| | DIETHYLENE GLYCOL MONOETHYL ETHER ACETATE | 17 | 17 | — | — |
| | TEXANOL | — | — | 17 | 17 |
| CHARACTERISTICS | SPECIFIC RESISTANCE($\Omega \cdot$ cm) | $7.7 \times 10^{-5}$ | $8.1 \times 10^{-6}$ | $5.6 \times 10^{-5}$ | $7.7 \times 10^{-6}$ |
| | ADHESION 1 | ○ | X | ○ | ○ |
| | ADHESION 2 | ○ | X | ○ | X |
| PRINTING CHARACTERISTICS | BLEEDING | X | X | X | ○ |
| | BLUR | X | X | X | X |
| | SAGGING | X | X | X | X |
| | MESH MARK | X | ○ | ○ | ○ |
| | SQUEEGEE STICKING PROPERTIES | X | X | X | ○ |
| MOUNTING PROPERTIES | SOLDER WETTABILITY | ○ | ○ | ○ | ○ |
| | MOUNTING STRENGTH | ⊚ | — | ⊚ | ⊚ |

[Evaluation]

For the conductive composition of each example, as same as in Example 1, evaluations for "specific resistance of conductor", "adhesion 1", "bleeding", "blur", "sagging", "mesh mark", and "sticking properties" were performed. Furthermore, the following evaluation was also performed for the conductive composition of each example. These results are indicated in Tables 6 to 10, respectively.

(Adhesion 2)

First, a circuit was printed with the conductive composition obtained in each example on a polyimide film using a screen printer so that the width was 1 mm, the length was 10 cm, and the thickness was 30 μm after calcining. Next, after the polyimide film on which the circuit was printed was allowed to stand at room temperature for 30 minutes, it was calcined with hot air at 140° C. for 30 minutes to produce a wiring board.

Next, the adhesive surface of the tape was pressure-bonded to the obtained wiring board with fingers so that no bubbles remained, and after about 10 seconds, the tape was quickly peeled off in a direction perpendicular to the printed surface. The tape used was a VHB ultra-strong double-sided tape, low VOC type, product number Y-4825K-08 manufactured by 3M, with an adhesive force of 38 N/10 mm was used.

Criteria

○: No print peeling is observed (a case where the peeled circuit cannot be checked on the tape side and a case where the peeling of the circuit cannot be checked visually on the wiring board side)

X: Print peeling is observed (a case where the peeled circuit can be checked on the tape side or a case where the peeling of the circuit can be checked visually on the wiring board side)

(Solder Wettability)

First, a circuit was printed with the conductive composition obtained in each example on a polyimide film using a screen printer so that the width was 1 mm, the length was 10 cm, and the thickness was 30 μm after calcining. Next, after the polyimide film on which the circuit was printed was allowed to stand at room temperature for 30 minutes, it was calcined with hot air at 140° C. for 30 minutes to produce a wiring board.

Next, an Sn—Bi low temperature solder was dropped on an Ag thin film on the obtained wiring board and heated, and then the solder wettability was evaluated. Specifically, a contact angle of the solder on the Ag thin film was measured by a θ/2 method using a contact angle meter. As the contact angle meter, CONTACT-ANGLE METER FACE TYPE01 manufactured by Kyowa Interface Science Co., Ltd. was used.

Criteria

○: Contact angle θ<90°

X: Contact angle θ≥90°

(Mounting Strength)

First, a circuit was printed with the conductive composition obtained in each example on a polyimide film using a screen printer so that the width was 1 mm, the length was 10 cm, and the thickness was 30 μm after calcining. Next, after the polyimide film on which the circuit was printed was allowed to stand at room temperature for 30 minutes, it was calcined with hot air at 140° C. for 30 minutes to produce a wiring board.

Next, a 0Ω resistor of 3216 size was soldered to an Ag thin film on the obtained wiring board using an Sn—Bi low temperature solder. Then, a shear strength of the obtained circuit was measured using a bond tester (SERIES4000, manufactured by Nordson Dage).

Criteria
⊚: Share strength is 50 N or more
◯: Share strength is 20 N or more and less than 50 N
X: Share strength is less than 20 N
-: Share strength cannot be measured As indicated in Table 6 and Table 7, in the wiring boards formed of the conductive compositions of Examples 2-1 to 2-10, the specific resistance of the conductor is small and the adhesion of the conductor to the substrate is also excellent. In addition, it can be seen that the conductors of these examples are evaluated as being excellent in the solder wettability and the mounting strength and excellent in the mounting properties.

On the other hand, as indicated in Table 8 to Table 10, in the wiring boards formed of the conductive compositions of Comparative Examples 2-1 to 2-13, the specific resistance of the conductor is large or the adhesion of the conductor to the substrate is not excellent. In particular, it can be seen that since the conductive compositions of Comparative Examples 2-1 and 2-3 have many resin components, the conductors formed by these resin components have insufficient solder wettability and mounting strength, and thus may be inferior in the mounting properties.

As described above, although the present invention was demonstrated by the examples, the present invention is not limited thereto, various modifications are possible within the range of the gist of the present invention.

The entire contents of Japanese Patent Application No. 2017-179961 (application date: Sep. 20, 2017) and Japanese Patent Application No. 2018-114377 (application date: Jun. 15, 2018) are incorporated herein by reference.

INDUSTRIAL APPLICABILITY

According to this invention, it is possible to provide a conductive composition capable of obtaining a conductor having a specific resistance equivalent to that of silver bulk and having excellent adhesion to a substrate, and a wiring board using the conductive composition.

What is claimed is:

1. A conductive composition comprising:
   metal nanoparticles having an average particle diameter of 350 nm to 600 nm;
   metal particles having an average particle diameter larger than that of the metal nanoparticles;
   a thermosetting resin having an oxirane ring in a molecule;
   a curing agent; and
   a cellulose resin,
   wherein the conductive composition is configured such that a specific resistance of a conductor having a width of 1 mm, a length of 10 cm, and a thickness of 30 μm formed by applying the conductive composition on a polyimide substrate and then calcining in heated air at a temperature of 140° C. for 30 minutes is $5.0 \times 10^{-6}$ Ωcm or less, and such that the conductor does not peel from the polyimide substrate when a tape having an adhesive force of 3.9 N/10 mm to 39 N/10 mm is pressed against the conductor and peeled off,
   wherein a total content of the thermosetting resin and the curing agent is 0.1% by mass to 2% by mass with respect to the entire conductive composition,
   wherein the thermosetting resin is selected from the group consisting of a bisphenol A type epoxy resin, a bisphenol F type epoxy resin, a novolac type epoxy resin, and an aliphatic type epoxy resin, and
   wherein the conductive composition does not contain an amine curing agent.

2. The conductive composition according to claim 1, wherein the curing agent is a 5-membered heterocyclic aromatic compound containing nitrogen.

3. The conductive composition according to claim 1, wherein a content ratio of the thermosetting resin and the curing agent is 1:1 to 4:1 by mass ratio.

4. The conductive composition according to claim 1, wherein a content of the cellulose resin is 0.1% by mass to 4% by mass with respect to the entire conductive composition.

5. The conductive composition according to claim 1, wherein an average particle diameter of the metal particles is 1 μm to 5 μm.

6. The conductive composition according to claim 1, wherein the cellulose resin is at least one selected from the group consisting of ethyl cellulose and hydroxyethyl methyl cellulose.

7. The conductive composition according to claim 1, wherein a content of the thermosetting resin that is selected from the group consisting of a bisphenol A type epoxy resin, a bisphenol F type epoxy resin, a novolac type epoxy resin, and an aliphatic type epoxy resin is 0.1 to 1.5% by mass with respect to the entire conductive composition.

* * * * *